(12) United States Patent
Lei

(10) Patent No.: US 7,631,289 B1
(45) Date of Patent: Dec. 8, 2009

(54) METHOD AND SYSTEM FOR IMPLEMENTING OPTIMIZED LITHOGRAPHY MODELS FOR ACCURACY AND RESOLUTION

(75) Inventor: Junjiang Lei, Bellevue, WA (US)

(73) Assignee: Cadence Design Systems, Inc., San Jose, CA (US)

( * ) Notice: Subject to any disclaimer, the term of this patent is extended or adjusted under 35 U.S.C. 154(b) by 315 days.

(21) Appl. No.: 11/770,568

(22) Filed: Jun. 28, 2007

(51) Int. Cl.
*G06F 17/50* (2006.01)
(52) U.S. Cl. ...................................................... 716/21
(58) Field of Classification Search ...................... 716/1, 716/19–21
See application file for complete search history.

(56) References Cited

U.S. PATENT DOCUMENTS

| | | | |
|---|---|---|---|
| 7,079,223 B2 * | 7/2006 | Rosenbluth et al. | 355/67 |
| 7,342,646 B2 * | 3/2008 | Shi et al. | 355/77 |
| 2005/0091631 A1 * | 4/2005 | Gallatin et al. | 716/20 |
| 2006/0282814 A1 * | 12/2006 | Percin et al. | 716/21 |
| 2007/0032896 A1 * | 2/2007 | Ye et al. | 700/108 |
| 2007/0234246 A1 * | 10/2007 | Sinha et al. | 716/4 |
| 2008/0127027 A1 * | 5/2008 | Gallatin et al. | 716/19 |

\* cited by examiner

*Primary Examiner*—Stacy A Whitmore
(74) *Attorney, Agent, or Firm*—Vista IP Law Group, LLP

(57) ABSTRACT

Disclosed is an improved method and system for creating lithography models. According to some approaches, a new method and system is disclosed for determining the number of matrices to use for representing an optical lithographic model. The approach is based upon a selected accuracy level, instead of requiring the user to select the number of matrices that is desired as was employed in the prior art. The method and system will then determine the number of matrices to use to support the accuracy that is desired.

71 Claims, 4 Drawing Sheets

METHOD AND SYSTEM FOR IMPLEMENTING OPTIMIZED LITHOGRAPHY MODELS FOR ACCURACY AND RESOLUTION

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. Many phases of electronic design activities may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. Based upon this geometric information, photomasks are created for lithographic manufacturing of the electronic product. A photomask, or more simply a "mask," provides the master image of one layer of a given integrated chip's physical geometries. A typical photolithography system projects UV light energy on to and through the mask in order to transmit the mask pattern in reduced size to the wafer surface, where it interacts with a photosensitive coating on the wafer.

Significant variations may arise during the process of manufacturing the IC. For example, lithography mask creation and printing assume that projection is done on a film, within a predetermined depth of focus range. However pattern dependencies between the process by which the ICs are fabricated and the pattern that is being created often cause processed films to have significant variation in thickness across a surface, resulting in variation in feature dimensions (e.g. line widths) of ICs that are patterned using the mask.

Lithography models may be created and used by EDA tools during many phases of the electronic design process, such as physical design, implementation, and verification. These models incorporate numerous mathematical matrices that relate to physical structures within the electronic design. However, using conventional approaches, it is often very difficult to determine the correct number of matrices that should be used for an optical lithography model. It is generally noted that the more matrices that are used, the more accurate is the model. The problem is that more matrices that are used, the more time and resources are needed to work upon the model by later EDA applications. Therefore, it is desired to be able to implement the model to be both as simple as possible and as accurate as possible. Clearly there is a tension between these two goals.

One possible approach is to allow the user to specifically select the number of matrices to use for the model. The problem with this approach is that in most cases, this method of selecting the number of matrices really is a result of the user guessing at the number of matrices that is needed. This guess is highly based highly subject to errors and wrong assumptions.

Another approach is to use the "forward analysis" approach. The forward analysis approach first requires the system to compute the entire set of matrices that the system can compute. The approach then work "backwards" to determine which set of matrices will produce the desired accuracy. The problem with this approach is that it is very resource intensive and may use an excessive amount of time and effort.

As is evident, there is a great need for a better approach to generate a lithography model, which can efficiently and accurately determine the number of matrices to use for the model.

SUMMARY OF THE INVENTION

The present invention is directed to an improved method and system for creating EDA models. According to some embodiments, a new method and system is disclosed for determining the number of matrices to use for representing an optical lithographic model. The approach is based upon a selected accuracy level, instead of requiring the user to select the number of matrices that is desired as was employed in the prior art. The invention will then determine the number of matrices to use to support the accuracy that is desired.

Other and additional objects, features, and advantages of the invention are described in the detailed description, figures, and claims.

DETAILED DESCRIPTION

The present invention is directed to an improved method and system for creating EDA models. According to some embodiments, a new method and system is disclosed for determining the number of matrices to use for representing an optical lithographic model.

The present invention is based upon a "backwards analysis" method for determining the number of matrices. Using the backwards analysis approach, the invention does not need to compute maximum number of matrices. Instead, the invention provides a very quick and efficient approach for determining the number of matrices for a desired accuracy level, even prior to actually computing the needed matrices and the eigenvalues associated to them. Upon having the knowledge of the number matrices needed, more efficient algorithms may be used to calculate the actual needed matrices and the corresponding eigenvalues.

Figure 1:
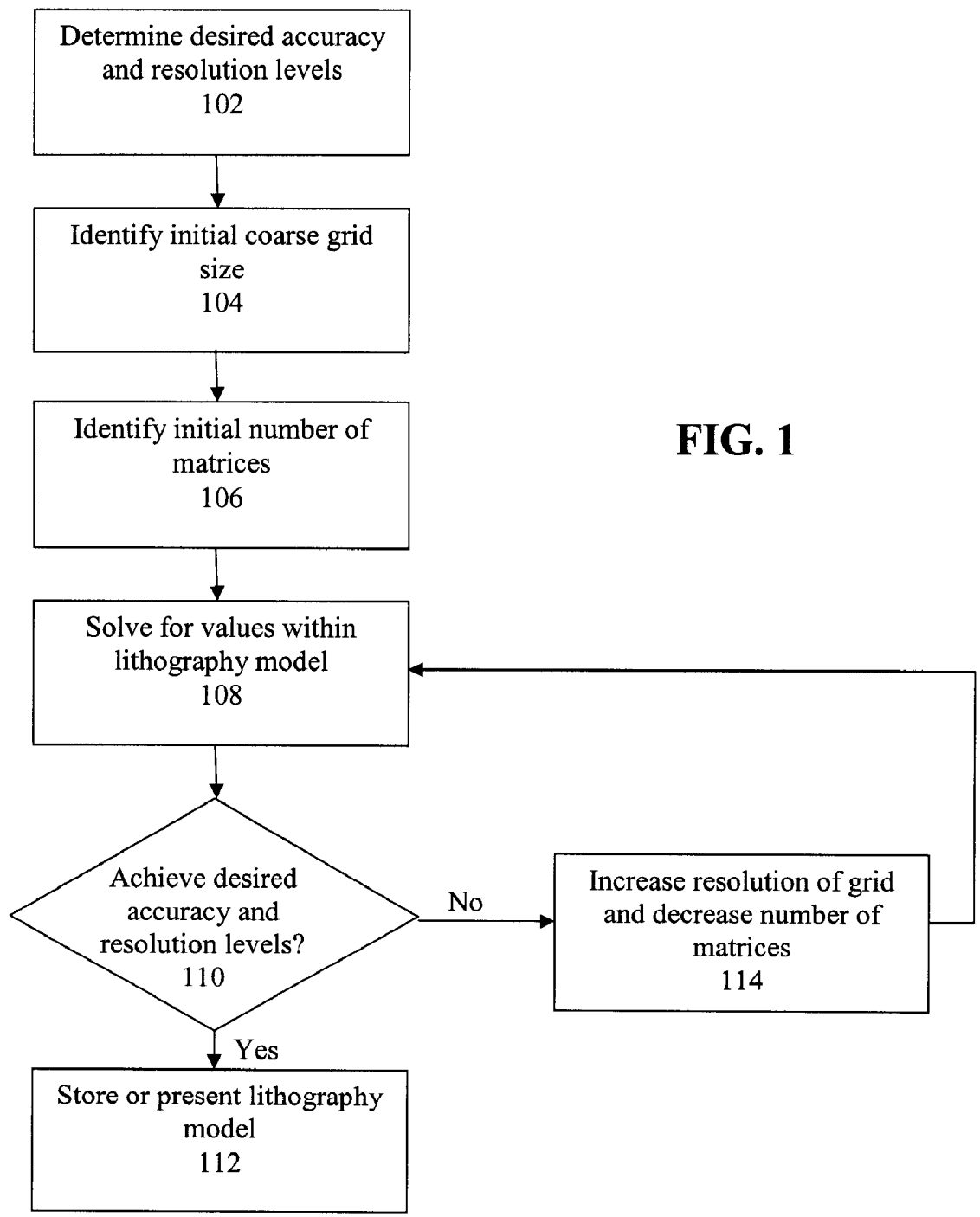
FIG. 1 shows a flowchart of a process for generating a lithography model.

FIG. 1 shows a flowchart of one approach for implementing the invention. The process begins by determining a desired or suitable resolution and accuracy level for the model (102).

In some embodiments, the desired resolution level is based upon a desired grid size for the model. For a given area of coverage, this value identifies the number of "pixels" of resolution that is used to evaluate that area, with each pixel corresponding to a unit of analysis. A coarse grid corresponds to a lower resolution level and a fine grid corresponds to a higher resolution level. The size of the matrices for the model is essentially controlled by the grid size.

The desired accuracy level can be specified as a desired percentage of eigenvalues. This value is a sum of the eigenvalues to be used over the sum of the total number of eigenvalues that may be established. This percentage provides a reasonably good hint for the desired accuracy. The desired accuracy level can be manually specified by a user or automatically determined.

Figure 2:
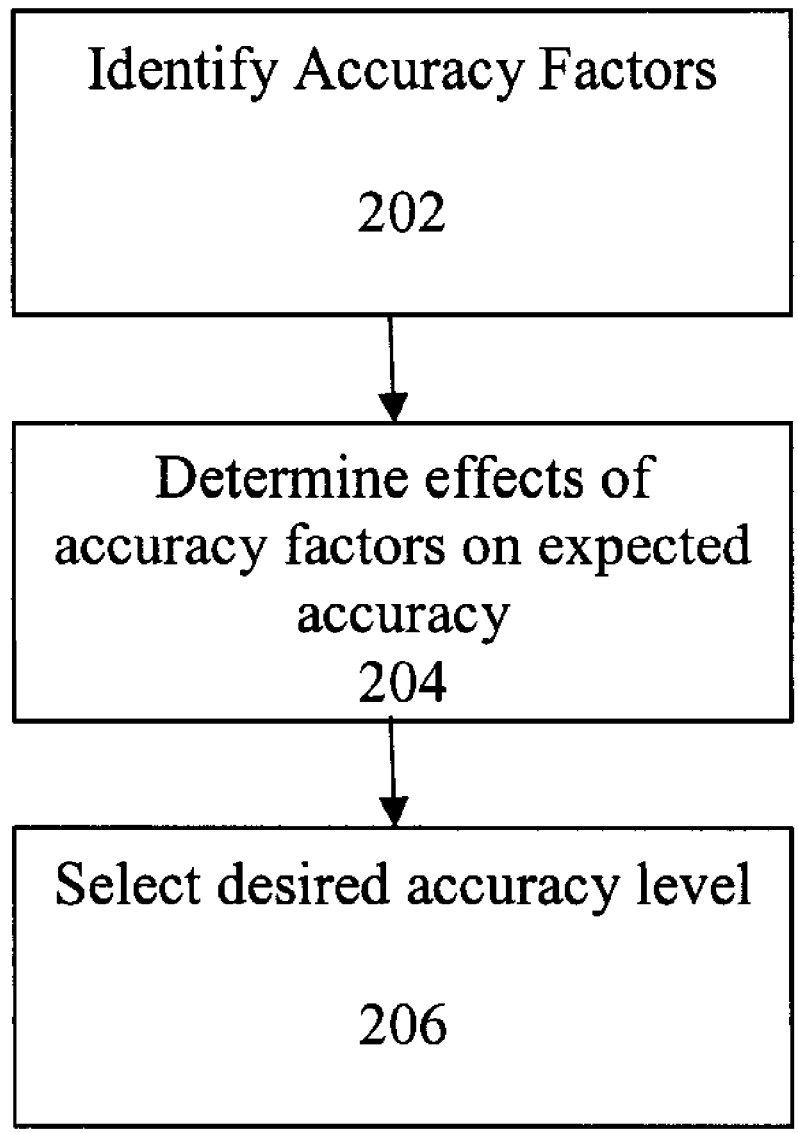
FIG. 2 shows a flowchart of a process for determining a desired accuracy level.

FIG. 2 is a flowchart of a embodiment of a method for determining a desirable or suitable accuracy level. The process first identifies one or more factors or parameters that will be used to calculate the desired accuracy (202). On example accuracy factor is the depth of focus for lithographic simulations. The depth of focus refers to the focal distance for the lens used to optically project light against a wafer. Since height variations may exist on the surface topography of a given wafer or based upon machine-related variations for the optical stepper equipment, it is possible that the expected depth of focus will vary from the actual depth of focus. Therefore, when lithographic model calibration is performed, adjustments may need to be made because of depth of focus issues. Another accuracy factor that may be considered is the partial coherence factor for the stepper process/equipment.

Based upon the identified accuracy factor(s), a determination is made whether the desired accuracy level should be adjusted either upwards or downwards (204). For example, consider again the depth of focus factor. If the theoretical focal length matches the actual depth of focus fairly closely, then it is likely that a very high accuracy level can be reasonably achieved and therefore one could specify a high accuracy level as the desired accuracy level. On the other hand, it is possible that the theoretical focal length differs substantially from the actual depth of focus. In this case, the desired accuracy level should be reduced to avoid excessively expensive calculations to determine the lithography model.

The desired accuracy level can thereafter be selected (206). According to some embodiments, the selected accuracy level can vary in the 70-95% range. A lower desired accuracy level can be selected in the 70-80% range, e.g., if the depth of focus varies significantly from the expected focal length. A higher desired accuracy level can be in the 90-95% range, e.g., if the if the depth of focus significantly matches the expected focal length. A generally suitable choice for the desired accuracy level is in the 80-85% range.

Returning back to FIG. 1, the process then selects an initial grid size and initial number of matrices for the analysis (104). As noted above, the size of the matrix will be controlled by the grid size. In the present invention, the process determines an initial coarse grid value to use for calculations, as opposed to an initial fine grid value. A coarse grid size will result in faster processing, whereas a finer grid size will provide better accuracy but slower processing. One approach for selecting an initial coarse grid size is to evaluate a small grid size that can be is both coarse in nature and yet still has enough resolution to comply with the Nyquist sampling rate. In some embodiments, a 64 by 64 grid can be selected as an initial coarse grid.

Next, the process makes a very conservative guess regarding the number of matrices (106). There are numerous ways to implement this step. One way is to allow the user or system to approximate a target number of matrices. Another approach is to establish a conservative initial threshold for the number of matrices. Yet another approach is to use heuristics or past results to determine the initial guess. Some factors to consider when selecting the number of eigenvalues is the depth of focus and partial coherence factors. For example, if the coherence factor is large, then one may wish to use a greater number of eigenvalues.

The process then solves for a kernel to compute eigenvalues and matrices (108). The kernel corresponds to the number of eigenfunctions and the amplitude of the kernel corresponds to the number of eigenvalues. The kernel essentially forms the numerical signature of a physical optical stepper device. The calculation of the kernel is based upon the coarse rate that had been determined along with the conservative initial guess. A lithography simulator is used to generate the kernel value. It is expected that this action will not take much time or resources because it is based upon a very coarse grid and the conservative initial guess.

The resultant set of eigenvalues and matrices are then matched up against the desired accuracy and resolution levels (110). If the desired accuracy and resolution levels are achieved, then the process ends and the model is stored in a compute readable medium and/or is presented to the user (112).

If the desired accuracy and resolution levels are not achieved, then the resolution is increased and the number of matrices are decreased (114). The process then iterates back to (108) for further calculations.

It is noted that the new iteration at the higher resolution/accuracy level is performed based upon the results obtained in the prior iteration. This prior iteration provides the initial starting values to use for the new iteration, which jumpstarts the process of solving for the kernel at the higher resolution/accuracy level.

The significance of this is quite important, since the amount of time and processing resources needed to solve for the kernel is directly correspondent to the selection of the initial values for the calculations. If an inaccurate set of initial values is selected, then it could cost a relatively large number of sub-iterations to calculate the kernel values, which directly results in a more expensive series of actions that take more time. On the other hand, if a good set of initial values is selected, a relatively few number of sub-iterations may be required to solve for the kernel values.

The advantage of the present approach is that it uses an iterative approach to obtain highly accurate results in a minimal amount of time. This is because the initial starting iteration/phase of the process, with a very coarse grid, is very fast to perform. At each subsequent iteration/phase, the granularity of the grid is incrementally increased to address a higher resolution, but that increase in resolution is combined with a better set of starting values as well. Therefore, even as the resolution and accuracy is incrementally increased, the calculations do not become prohibitively expensive at each iteration/phase since the calculations are also only incrementally increased. By the end of the process, the combined total of the steady and incremental increase in resolution and accuracy results in a highly accurate and a fine-resolution model for the lithography process/equipment.

Figure 3:
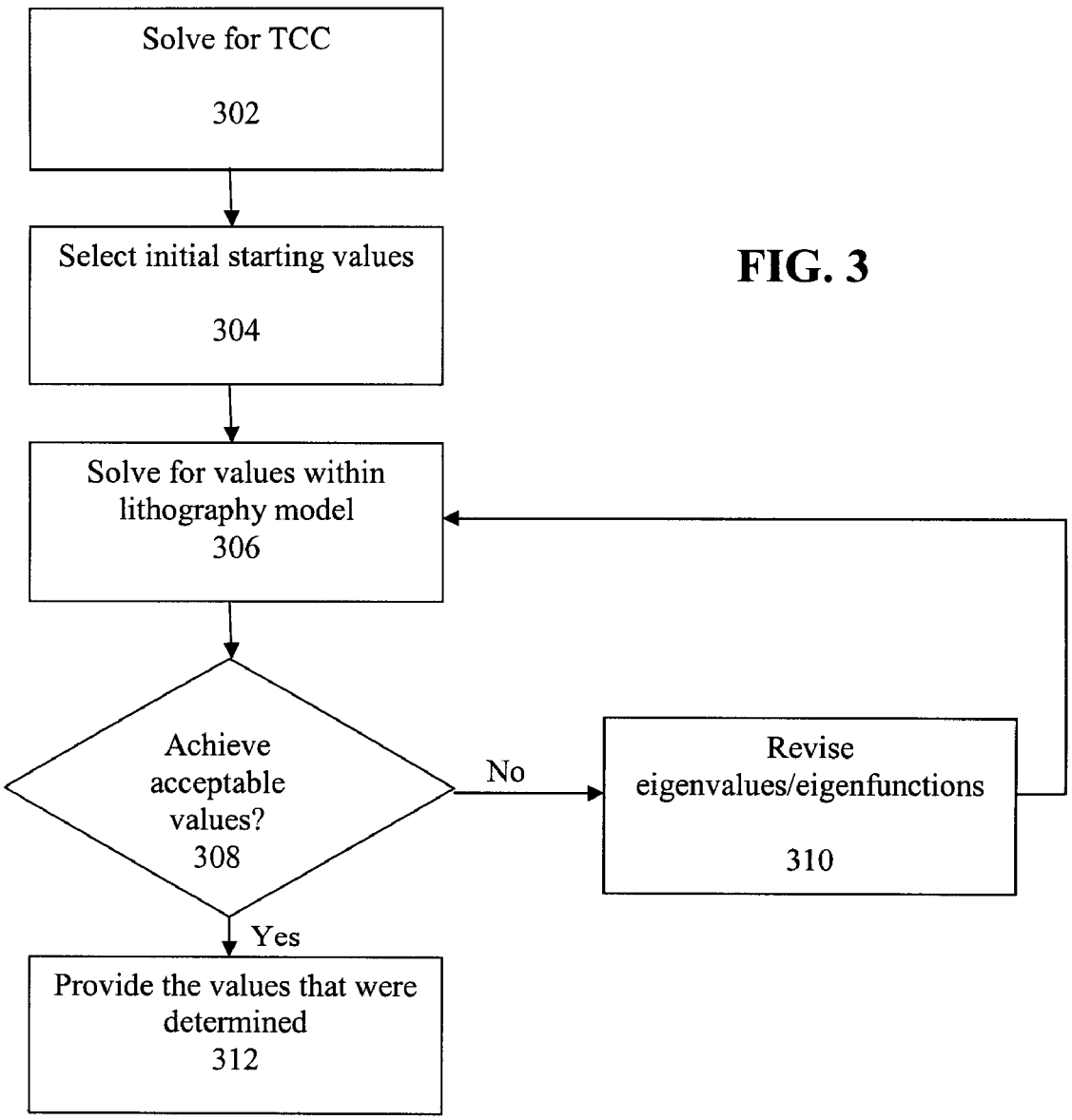
FIG. 3 shows a shows a flowchart of a process for iterating to determine a suitable lithography model.

FIG. 3 shows a more detailed flowchart of the details within each iteration to determine the lithography model. Within each iteration, the process solves for a TCC (transmission cross coefficient) value based upon the selected grid size and number of matrices (302). The TCC value can be determined based upon the following equation:

$$TCC = F^T DF \qquad \text{(Equation 1)}$$

where F corresponds to the eigenfunctions, $F^T$ corresponds to a transposed version of F, and D corresponds to the eigenvalues. The goal is to identify the values of F and D.

This begins in the very first iteration by an educated guess regarding the values of F and D (304). There are a number of suitable approaches that can be taken to evaluate F. A first example approach is to use random numbers. A second example approach is to use a sequence of 0's or 1's. A third example approach is to use Zernicke's polynomials as the initially selected values.

Based upon the selected values, the equations are solved to determine F and D (306). To determine if the F and D values are correct, the following equation is evaluated:

$$\|TCC - F^H DF\| < \text{Preset Value} \qquad \text{(Equation 2)}$$

where the Preset Value is a set value, such as $10^{-11}$, which establishes an acceptable threshold band level.

If the equation is true, then the value of F and D are acceptable (308). If the equation is false, then an additional loop is performed with a modified set of values for F and D (310). The amount of modification for the values of F and D is guided by the results of evaluating Equation 2 and the amount by which the equation is not met. The process loops back from (310) to (306) with intelligent changes to the values of F and D until the values are judged to be acceptable based upon Equation 2.

For a very coarse grid, this is a very fast equation to solve for, since the grid size is relatively small. It is noted that the solution for the coarse grid size, even though it is very fast to identify, is not likely to provide the desired resolution level. However, what it does provide is a very good estimate for a next iteration at a incrementally finer grid size that significantly speeds up the calculations for that next grid size.

Therefore, if the desired accuracy or resolution level is not achieved, then the overall process undergoes another iteration (as previously described with respect to FIG. 1). The process continues by increasing the grid size, which will increase the resolution of the model. In one approach, this is performed by doubling the size of each length parameter of the grid. For example, if the previous grid size is 64 by 64, then the next incrementally finer grid size is 128 by 128, which is incremented in a subsequent iteration to 256 by 256, which is incremented in a subsequent iteration to 256 by 256. It is noted that any suitable approach can be taken to select the amount of increase in resolution and grid size within the scope of the invention.

Then, the number of matrices is decreased as well when the resolution is increased. For example, if the number of matrices in a previous iteration is 100, then the next iteration may reduce the number of matrices to a range of 60 to 70. The criteria for amount of decrease depends upon the specific application to which the invention is directed, and may be guided by experiences and results from past application of the technique for similar purposes.

For the larger grid size, the results of the previous analysis for a smaller grid size is interpolated to fill in the new grid. Zero padding is one example approach that can be used to perform this type of interpolation.

The process returns back to the method shown in FIG. 3 to solve for the values of F and D. The interpolated results provide the intelligent starting point to use for the new set of calculations for the larger grid size. In this way, the set of sub-iterations required by the process of FIG. 3 to determine the values of F and D is given a very significant headstart, which dramatically reduces the amount of time and processing resources needed to solve for the F and D values.

The iterations continue until the desired resolution level has been achieved with the desired accuracy level. The number of matrices at that point can then be considered the optimal set of matrices for the lithography model for the stated accuracy level.

One enhancement that can be made to the process is to provide an algorithmic approach to verify that the number of matrices is sufficient and that the number of matrices is not under-selected.

The lithography models based upon the present invention can be used by EDA tools during the electronic design process. For example, the models maybe employed for model-based design and implementation of an integrated circuit design. In addition, the lithography models may be employed to perform lithography simulation and model-based verification of an integrated circuit design.

System Architecture Overview

Figure 4:
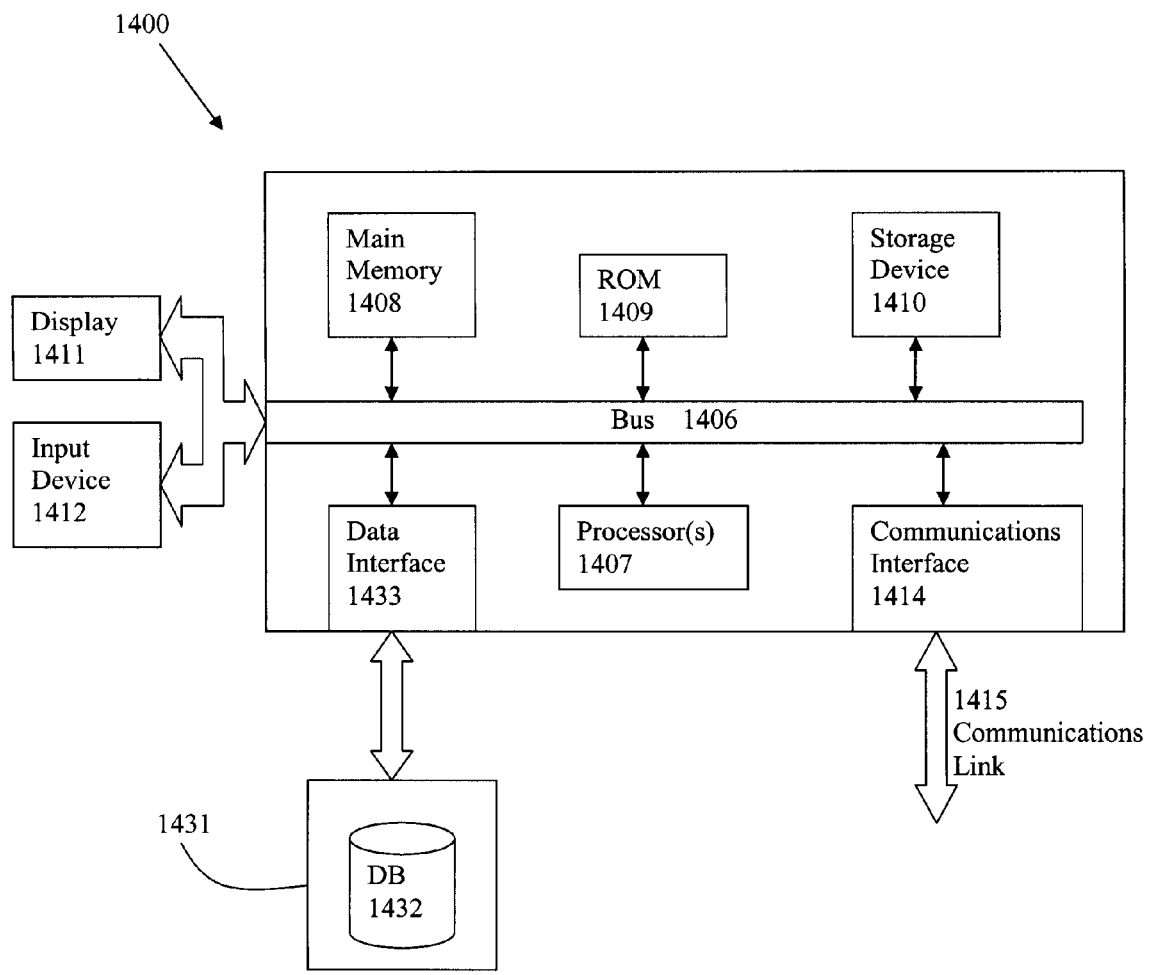
FIG. 4 shows an architecture of an example computing system with which the invention may be implemented.

FIG. 4 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method of generating a lithography model implemented with a processor, comprising:
   (a) determining a desired accuracy level for the lithography model;
   (b) determining a desired resolution level for the lithography model;
   (c) identifying a starting coarse grid size for a grid size to calculate the lithography model;
   (d) identifying a starting value for a number of matrices to use to calculate the lithography model;
   (e) calculating the lithography model based upon the grid size and the number of matrices;
   (f) determining if the lithography model corresponds to an acceptable resolution;
   (g) if the lithography model does not correspond to an acceptable resolution, then increasing the size of the grid size and reducing the number of matrices;
   (h) iterating from (e) to (g) until and acceptable resolution level is achieved for the lithography model; and
   (i) storing the lithography model in a computer usable medium.

2. The method of claim 1 in which the desired accuracy level corresponds to a desired percentage of eigenvalues.

3. The method of claim 2 in which the desired percentage corresponds to a sum of eigenvalues over a sum of total number of eigenvalues that may be established.

4. The method of claim 1 in which the desired accuracy level is determined by a process, comprising:
   identifying one or more accuracy factors;
   determining effects of the one or more accuracy factors on expected accuracy; and
   selecting the destined accuracy level based upon the determined effects.

5. The method of claim 4 in which the one or more accuracy factors comprise depth of focus or a partial coherence factor for lithography equipment.

6. The method of claim 1 in which the starting coarse grid size corresponds to sufficient resolution to comply with Nyquist sampling rate.

7. The method of claim 1 in which a kernel is determined to compute eigenvalues and matrices.

8. The method of claim 7 in which the kernel is generated using a lithography simulator.

9. The method of claim 7 in which the eigenvalues and the matrices are analyzed to determine if the lithography model corresponds to the acceptable resolution.

10. The method of claim 1 in which the lithography model is determined by determining a TCC (transmission cross coefficient) value.

11. The method of claim 1 in which the lithography model is determined by
    solving for eigenvalue and eigenfunction values within a lithography model;
    determining the eigenvalue and eigenfunction values are acceptable; and
    revising the eigenvalue and eigenfunction values and iterating until the eigenvalue and eigenfunction values are acceptable.

12. The method of claim 1 in which interpolation is employed to use previous results for a smaller grid size for a larger grid size.

13. The method of claim 1 in which the number of matrices is verified to make sure it is sufficient.

14. The method of claim 1 in which the lithography model is used for model-based design, implementation, or verification of an integrated circuit design.

15. The method of claim 1 in which the lithography model is used for lithography simulation.

16. A method of generating a lithography model implemented with a processor, comprising:
    (a) determining a desired accuracy level for the lithography model;
    (b) determining a starting grid size and number of matrices for the lithography model, wherein the starting grid size corresponds to a coarse grid;
    (c) determining eigenvalues and matrices for the lithography model based upon the grid size and the number of matrices;
    (d) determining if the eigenvalues and matrices corresponds to an acceptable accuracy and resolution;
    (e) if the lithography model does not correspond to an acceptable accuracy and resolution, then increasing the size of the grid size and reducing the number of matrices;
    (f) iterating from (c) to (e) until an acceptable accuracy and resolution level are achieved for the lithography model; and
    (g) storing the lithography model in a computer usable medium.

17. The method of claim 16 in which the desired accuracy level corresponds to a desired percentage of eigenvalues.

18. The method of claim 17 in which the desired percentage corresponds to a sum of eigenvalues over a sum of total number of eigenvalues that may be established.

19. The method of claim 16 in which the desired accuracy level is determined by a process, comprising:
    identifying one or more accuracy factors;
    determining effects of the one or more accuracy factors on expected accuracy; and
    selecting the destined accuracy level based upon the determined effects.

20. The method of claim 19 in which the one or more accuracy factors comprise depth of focus or a partial coherence factor for lithography equipment.

21. The method of claim 16 in which a kernel is determined to compute the eigenvalues and the matrices.

22. The method of claim 21 in which the kernel is generated using a lithography simulator.

23. The method of claim 21 in which the eigenvalues and the matrices are analyzed to determine if the lithography model corresponds to the acceptable resolution.

24. The method of claim 16 in which the lithography model is determined by determining a TCC (transmission cross coefficient) value.

25. The method of claim 16 in which the lithography model is determined by
   solving for eigenvalue and eigenfunction values within a lithography model;
   determining the eigenvalue and eigenfunction values are acceptable; and
   revising the eigenvalue and eigenfunction values and iterating until the eigenvalue and eigenfunction values are acceptable.

26. The method of claim 16 in which interpolation is employed to use previous results for a smaller grid size for a larger grid size.

27. The method of claim 16 in which the number of matrices is verified to make sure it is sufficient.

28. The method of claim 16 in which the lithography model is used for model-based design, implementation, or verification of an integrated circuit design.

29. The method of claim 16 in which the lithography model is used for lithography simulation.

30. A computer program product that includes a computer readable medium, the computer readable medium comprising a plurality of computer instructions which, when executed by a processor, cause the processor to execute performing a process for generating a lithography model, the process comprising:
   (a) determining a desired accuracy level for the lithography model;
   (b) determining a desired resolution level for the lithography model;
   (c) identifying a starting coarse grid size for a grid size to calculate the lithography model;
   (d) identifying a starting value for a number of matrices to use to calculate the lithography model;
   (e) calculating the lithography model based upon the grid size and the number of matrices;
   (f) determining if the lithography model corresponds to an acceptable resolution;
   (g) if the lithography model does not correspond to an acceptable resolution, then increasing the size of the grid size and reducing the number of matrices;
   (h) iterating from (e) to (g) until and acceptable resolution level is achieved for the lithography model; and
   (i) storing the lithography model in a computer usable medium.

31. A system of generating a lithography model, comprising:
   (a) means for determining a desired accuracy level for the lithography model;
   (b) means for determining a desired resolution level for the lithography model;
   (c) means for identifying a starting coarse grid size for a grid size to calculate the lithography model;
   (d) means for identifying a starting value for a number of matrices to use to calculate the lithography model;
   (e) means for calculating the lithography model based upon the grid size and the number of matrices;
   (f) means for determining if the lithography model corresponds to an acceptable resolution;
   (g) means for increasing the size of the grid size and reducing the number of matrices if the lithography model does not correspond to an acceptable resolution;
   (h) means for iterating from (e) to (g) until and acceptable resolution level is achieved for the lithography model; and
   (i) means for storing the lithography model in a computer usable medium.

32. A computer program product that includes a computer readable medium, the computer readable medium comprising a plurality of computer instructions which, when executed by a processor, cause the processor to execute performing a process for generating a lithography model, the process comprising:
   (a) determining a desired accuracy level for the lithography model;
   (b) determining a starting grid size and number of matrices for the lithography model, wherein the starting grid size corresponds to a coarse grid;
   (c) determining eigenvalues and matrices for the lithography model based upon the grid size and the number of matrices;
   (d) determining if the eigenvalues and matrices corresponds to an acceptable accuracy and resolution;
   (e) if the lithography model does not correspond to an acceptable accuracy and resolution, then increasing the size of the grid size and reducing the number of matrices;
   (o) iterating from (c) to (e) until an acceptable accuracy and resolution level are achieved for the lithography model; and
   (g) storing the lithography model in a computer usable medium.

33. A system of generating a lithography model, comprising:
   (a) determining a desired accuracy level for the lithography model;
   (b) determining a starting grid size and number of matrices for the lithography model, wherein the starting grid size corresponds to a coarse grid;
   (c) determining eigenvalues and matrices for the lithography model based upon the grid size and the number of matrices;
   (d) determining if the eigenvalues and matrices corresponds to an acceptable accuracy and resolution;
   (e) if the lithography model does not correspond to an acceptable accuracy and resolution, then increasing the size of the grid size and reducing the number of matrices;
   (f) iterating from (c) to (e) until an acceptable accuracy and resolution level are achieved for the lithography model; and
   (g) storing the lithography model in a computer usable medium.

34. The computer program product of claim 30 in which the desired accuracy level corresponds to a desired percentage of eigenvalues.

35. The computer program product of claim 30 in which the desired accuracy level is determined by a process, comprising:
   identifying one or more accuracy factors;
   determining effects of the one or more accuracy factors on expected accuracy; and
   selecting the destined accuracy level based upon the determined effects.

36. The computer program product of claim 30 in which the starting coarse grid size corresponds to sufficient resolution to comply with Nyquist sampling rate.

37. The computer program product of claim 30 in which a kernel is determined to compute eigenvalues and matrices.

38. The computer program product of claim 30 in which the lithography model is determined by determining a TCC (transmission cross coefficient) value.

39. The computer program product of claim 30 in which the lithography model is determined by
solving for eigenvalue and eigenfunction values within a lithography model;
determining the eigenvalue and eigenfunction values are acceptable; and
revising the eigenvalue and eigenfunction values and iterating until the eigenvalue and eigenfunction values are acceptable.

40. The computer program product of claim 30 in which interpolation is employed to use previous results for a smaller grid size for a larger grid size.

41. The computer program product of claim 30 in which the number of matrices is verified to make sure it is sufficient.

42. The computer program product of claim 30 in which the lithography model is used for model-based design, implementation, or verification of an integrated circuit design.

43. The computer program product of claim 30 in which the lithography model is used for lithography simulation.

44. The system of claim 31 in which the desired accuracy level corresponds to a desired percentage of eigenvalues.

45. The system of claim 31 in which the desired accuracy level is determined by:
means for identifying one or more accuracy factors;
means for determining effects of the one or more accuracy factors on expected accuracy; and
means for selecting the destined accuracy level based upon the determined effects.

46. The system of claim 31 in which the starting coarse grid size corresponds to sufficient resolution to comply with Nyquist sampling rate.

47. The system of claim 31 in which a kernel is determined to compute eigenvalues and matrices.

48. The system of claim 31 in which the lithography model is determined by determining a TCC (transmission cross coefficient) value.

49. The system of claim 31 in which the lithography model is determined by
means for solving for eigenvalue and eigenfunction values within a lithography model;
means for determining the eigenvalue and eigenfunction values are acceptable; and
means for revising the eigenvalue and eigenfunction values and iterating until the eigenvalue and eigenfunction values are acceptable.

50. The system of claim 31 in which interpolation is employed to use previous results for a smaller grid size for a larger grid size.

51. The system of claim 31 in which the number of matrices is verified to make sure it is sufficient.

52. The system of claim 31 in which the lithography model is used for model-based design, implementation, or verification of an integrated circuit design.

53. The system of claim 31 in which the lithography model is used for lithography simulation.

54. The computer program product of claim 32 in which the desired accuracy level corresponds to a desired percentage of eigenvalues.

55. The computer program product of claim 32 in which the desired accuracy level is determined by a process, comprising:
identifying one or more accuracy factors;
determining effects of the one or more accuracy factors on expected accuracy; and
selecting the destined accuracy level based upon the determined effects.

56. The computer program product of claim 32 in which a kernel is determined to compute the eigenvalues and the matrices.

57. The computer program product of claim 32 in which the lithography model is determined by determining a TCC (transmission cross coefficient) value.

58. The computer program product of claim 32 in which the lithography model is determined by
solving for eigenvalue and eigenfunction values within a lithography model;
determining the eigenvalue and eigenfunction values are acceptable; and
revising the eigenvalue and eigenfunction values and iterating until the eigenvalue and eigenfunction values are acceptable.

59. The computer program product of claim 32 in which interpolation is employed to use previous results for a smaller grid size for a larger grid size.

60. The computer program product of claim 32 in which the number of matrices is verified to make sure it is sufficient.

61. The computer program product of claim 32 in which the lithography model is used for model-based design, implementation, or verification of an integrated circuit design.

62. The computer program product of claim 32 in which the lithography model is used for lithography simulation.

63. The system of claim 33 in which the desired accuracy level corresponds to a desired percentage of eigenvalues.

64. The system of claim 33 in which the desired accuracy level is determined by:
means for identifying one or more accuracy factors;
means for determining effects of the one or more accuracy factors on expected accuracy; and means for selecting the destined accuracy level based upon the determined effects.

65. The system of claim 33 in which a kernel is determined to compute the eigenvalues and the matrices.

66. The system of claim 33 in which the lithography model is determined by determining a TCC (transmission cross coefficient) value.

67. The system of claim 33 in which the lithography model is determined by
means for solving for eigenvalue and eigenfunction values within a lithography model;
means for determining the eigenvalue and eigenfunction values are acceptable; and
means for revising the eigenvalue and eigenfunction values and iterating until the eigenvalue and eigenfunction values are acceptable.

68. The system of claim 33 in which interpolation is employed to use previous results for a smaller grid size for a larger grid size.

69. The system of claim 33 in which the number of matrices is verified to make sure it is sufficient.

70. The system of claim 33 in which the lithography model is used for model-based design, implementation, or verification of an integrated circuit design.

71. The system of claim 33 in which the lithography model is used for lithography simulation.

* * * * *